United States Patent
Gai

(10) Patent No.: US 9,935,059 B2
(45) Date of Patent: Apr. 3, 2018

(54) WAFER STRUCTURE, FABRICATION METHOD, AND SPRAY APPARATUS

(71) Applicants: Semiconductor Manufacturing International (Beijing) Corporation, Beijing (CN); Semiconductor Manufacturing International (Shanghai) Corporation, Shanghai (CN)

(72) Inventor: Jingfeng Gai, Beijing (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(*) Notice: Subject to any disclaimer, the term of this patent is extended or adjusted under 35 U.S.C. 154(b) by 0 days.

(21) Appl. No.: 15/242,559

(22) Filed: Aug. 21, 2016

(65) Prior Publication Data

US 2017/0062359 A1    Mar. 2, 2017

(30) Foreign Application Priority Data

Aug. 31, 2015 (CN) .......................... 2015 1 0547844

(51) Int. Cl.
*H01L 21/02* (2006.01)
*H01L 23/00* (2006.01)
*H01L 21/687* (2006.01)
*B05B 12/08* (2006.01)

(52) U.S. Cl.
CPC ............ *H01L 23/562* (2013.01); *B05B 12/08* (2013.01); *H01L 21/02164* (2013.01); *H01L 21/02282* (2013.01); *H01L 21/02362* (2013.01); *H01L 21/68764* (2013.01)

(58) Field of Classification Search
CPC ............ H01L 21/02164; H01L 23/562; H01L 21/02282; H01L 21/02362
See application file for complete search history.

(56) References Cited

U.S. PATENT DOCUMENTS 5,494,849 A * 2/1996 Iyer ..................... H01L 21/3226
148/DIG. 12

* cited by examiner

*Primary Examiner* — Amar Movva
(74) *Attorney, Agent, or Firm* — Anova Law Group, PLLC

(57) ABSTRACT

A wafer structure and a method for fabricating the wafer structure, and a spray apparatus are provided. An exemplary method for forming the wafer structure includes providing a wafer having a central region and a peripheral region surrounding the central region; forming an interlayer dielectric layer on a surface of the wafer in the central region not in the peripheral region; forming a buffer layer on the surface of the wafer in the peripheral region not in the central region; and forming a glue layer on the interlayer dielectric layer and the buffer layer. The buffer layer is used to reduce the lattice mismatch between the wafer and the glue layer; and reduce the stress between the wafer and the glue layer.

7 Claims, 4 Drawing Sheets

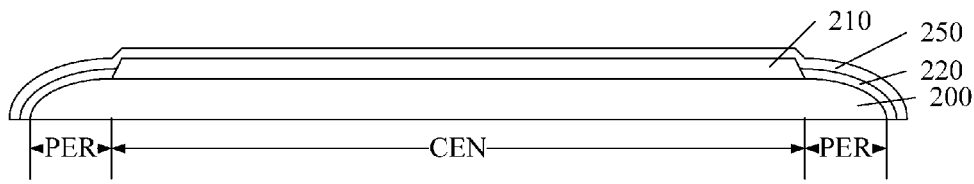
FIG. 10
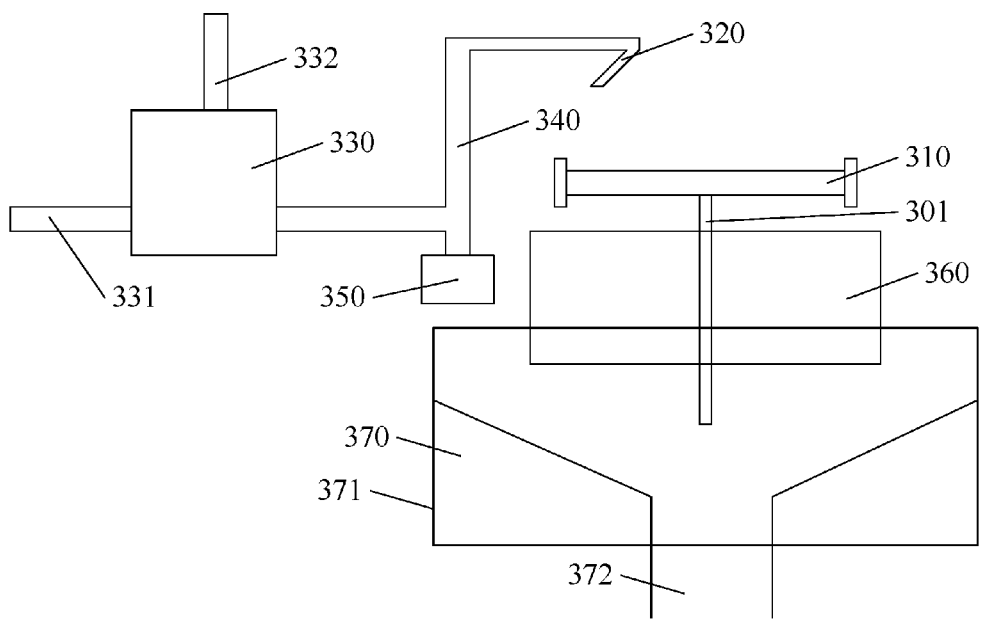
FIG. 11
| | S101 |
|---|---|
| Providing a wafer having a center region and a peripheral region; and forming an interlayer dielectric layer on the wafer in the center region | |
| | S102 |
| Forming a buffer layer on the wafer in the peripheral region | |
| | S103 |
| Forming a glue layer on the interlayer dielectric layer and the buffer layer | |
FIG. 12

WAFER STRUCTURE, FABRICATION METHOD, AND SPRAY APPARATUS

CROSS-REFERENCES TO RELATED APPLICATIONS

This application claims the priority of Chinese patent application No. 201510547844.2, filed on Aug. 31, 2015, the entirety of which is incorporated herein by reference.

FIELD OF THE INVENTION

The present invention generally relates to the field of semiconductor manufacturing and, more particularly, relates to wafer structures and fabrication processes, and spray apparatus.

BACKGROUND

With the continuous development of the manufacturing technology of integrated circuits (ICs), the integration level and performance requirements of the ICs have become higher and higher. In order to increase the integration level and reduce the production cost, the critical dimension (CD) of the devices in ICs has become smaller and smaller; and the device density inside the ICs has become larger and larger. Such developments have caused the surface of a wafer to be unable to provide enough area to form interconnect lines. To match the needs for the interconnect lines after the CD is reduced, the electrical connections among different metal layers and/or the electrical connections between the metal layers and the wafer (or substrate) are realized by interconnect structures.

The metal materials used for forming the interconnect structure are usually difficult to adhere to semiconductor materials of the device structures. Thus, a glue layer is usually formed on the semiconductor material before forming the interconnect structure. The glue layer is used to increase the interconnect strength between the metal interconnect structure and the semiconductor material.

However, the glue layer formed by existing techniques is often easy to peel off, and/or to have bubbles. Such defects may affect the performance of the semiconductor devices. The disclosed device structures, methods and apparatus are directed to solve one or more problems set forth above and other problems in the art.

BRIEF SUMMARY OF THE DISCLOSURE

One aspect of the present disclosure includes a method for fabricating a wafer structure. An exemplary method includes providing a wafer having a central region and a peripheral region surrounding the central region; forming an interlayer dielectric layer on a surface of the wafer in the central region not in the peripheral region; forming a buffer layer on the surface of the wafer in the peripheral region not in the central region; and forming a glue layer on the interlayer dielectric layer and the buffer layer. The buffer layer is used to reduce the lattice mismatch between the wafer and the glue layer; and reduce the stress between the wafer and the glue layer.

Another aspect of the present disclosure includes a wafer structure. The wafer structure includes a wafer having a central region and a peripheral region surrounding the central region; an interlayer dielectric layer formed on a surface of the wafer in the central region not in the peripheral region; a buffer layer formed on the surface of the wafer in the peripheral region not in the central region; and a glue layer formed on the interlayer dielectric layer and the buffer layer. The buffer layer is used to reduce the lattice mismatch between the wafer and the glue layer; and reduce the stress between the wafer and the glue layer.

Another aspect of the present disclosure includes a spray apparatus for forming a buffer layer on a surface of a wafer in a peripheral region. The spray apparatus includes a chunk, configured to hold a wafer having a central region and a peripheral region surrounding the central region; a spray nozzle, disposed over the chunk and configured to spray a liquid to the wafer on the chunk to form a buffer layer on a surface of the wafer in the peripheral region not in the central region; and a mixing pump, connected with the spray nozzle and configured to feed the liquid to the spray nozzle.

Other aspects of the present disclosure can be understood by those skilled in the art in light of the description, the claims, and the drawings of the present disclosure.

BRIEF DESCRIPTION OF THE DRAWINGS

FIG. 10 illustrates an exemplary wafer structure consistent with the disclosed embodiments;

FIG. 11 illustrates an exemplary spray apparatus consistent with the disclosed embodiments; and FIG. 12 illustrates an exemplary fabrication process of a wafer structure consistent with the disclosed embodiments.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

FIGS. 1-4 illustrate structures corresponding to certain stages of an existing fabrication process of a glue layer or an adhesion layer. The glue layer is used as a part of the interconnect structure.

Figure 1:
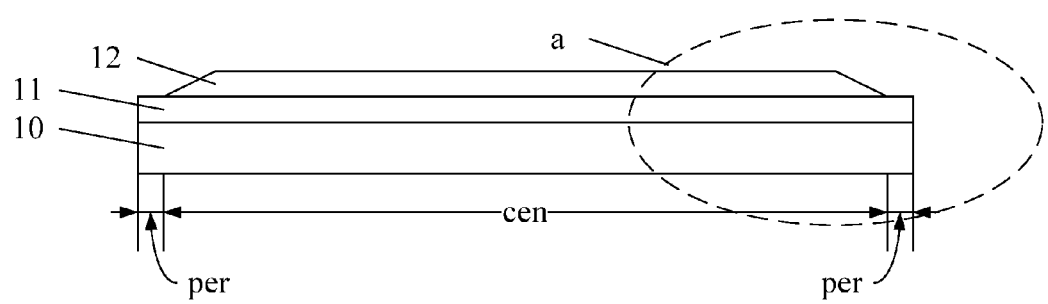
FIGS. 1-4 illustrate structures corresponding to certain stages of an existing fabrication process of a glue layer.
Figure 2:
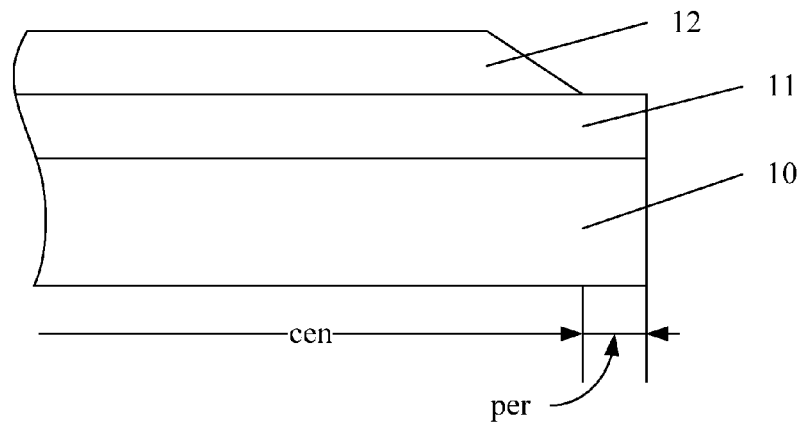

As shown in FIGS. 1-2 (FIG. 2 is a zoom-in image of the position "a" illustrated in FIG. 1), the fabrication process includes providing a wafer 10. The wafer 10 has a central region "cen" and a peripheral region "per". An interlayer dielectric layer 11 and a mask layer 12 are sequentially formed on the surface of the wafer 10.

During the process for forming the interconnect structure by etching the inter layer dielectric layer 11, a sidewall collapsing phenomenon may happen in the peripheral region "per" of the mask layer 12. Thus, to obtain a better exposure effect, the mask layer 12 only covers the central region "cer" of the wafer 10.

Figure 3:
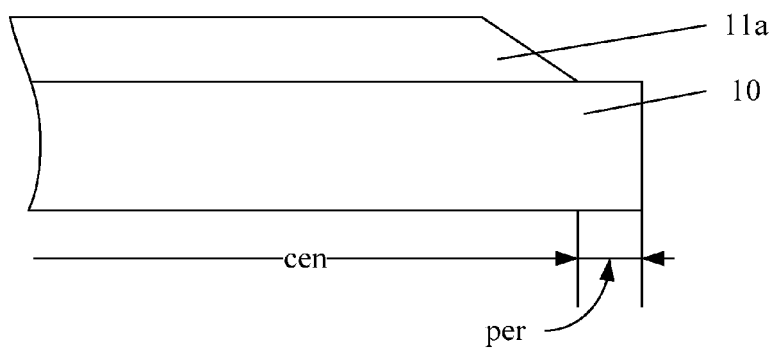
Figure 4:
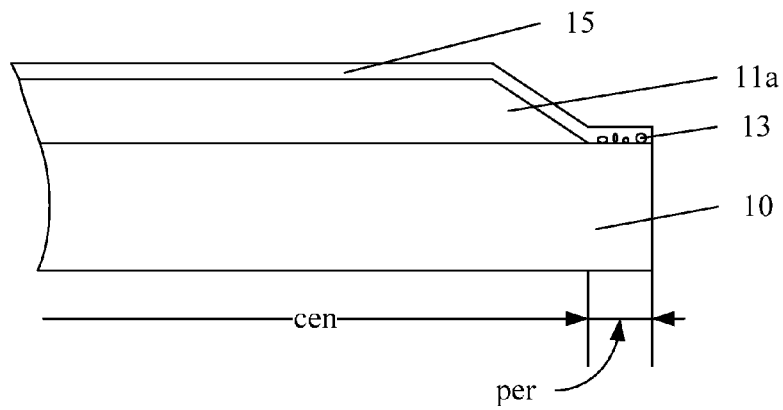

Therefore, after an etching process, as shown in FIG. 3, the patterned interlayer dielectric layer 11a also only covers the central region "cer" of the wafer 10. Further, as shown in FIG. 4, the process also includes forming the glue layer 15. The glue layer 15 covers the patterned interlayer dielectric layer 11a on the central region "cer" and the exposed peripheral region "per" of the wafer 10.

In the peripheral region "per", the glue layer 15 is directly formed on the wafer 10. The lattice mismatch between the glue layer 15 and the wafer 10 is relatively large. Thus, the portion of the glue layer 15 in the peripheral region "per" and the surface of the wafer 10 may have a relatively large stress. Therefore, it is easy for the portion of the glue layer 15 in the peripheral region "per" to have a peeling effect and/or a bubbling effect, i.e., forming bubbles 13; and the yield of the semiconductor devices is adversely affected.

In the existing technique, a cleaning process before the etching process may be omitted; and a native oxide layer on the wafer 10 may be kept. The native oxide layer may be used as a buffer layer between the glue layer 15 and the wafer 10. However, because the wafer 10 is not cleaned, the residues in central region "cer" of the wafer 10 will affect the performance of the semiconductor devices; and the yield of the semiconductor devices is also adversely affected.

Figure 5:
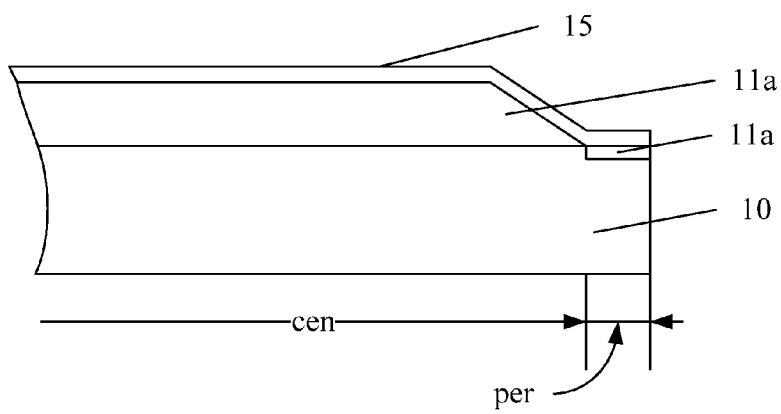
FIG. 5 illustrates a glue layer corresponding to a certain stage of another existing fabrication process of a glue layer.

FIG. 5 illustrates a structure corresponding to a certain stage of another existing fabrication process of a glue layer. As shown in FIG. 5, a step structure is formed in the peripheral region "per" of the wafer 10. Thus, the patterned interlayer dielectric layer 11a covers the step formed in the wafer 10. The glue layer 15 is formed on the patterned interlayer dielectric layer 11a. The patterned interlayer dielectric layer 11a may be used as a buffer layer to reduce the stress between the glue layer 15 and the wafer 10 to prevent the defects. However, the step structure changes the thickness uniformity of the wafer 10; and may affect the exposure step of a photolithography process for forming the interconnect structure. Accordingly, the performance of the semiconductor devices is also affected.

The present disclosure provides an improved fabrication process. FIG. 12 illustrates an exemplary fabrication process of a wafer structure consistent with the disclosed embodiments. FIGS. 6-9 illustrate structures corresponding to certain stages of the exemplary fabrication process. For illustrative purposes, the formation of the glue layer of an interconnect structure will be described.

Figure 6:
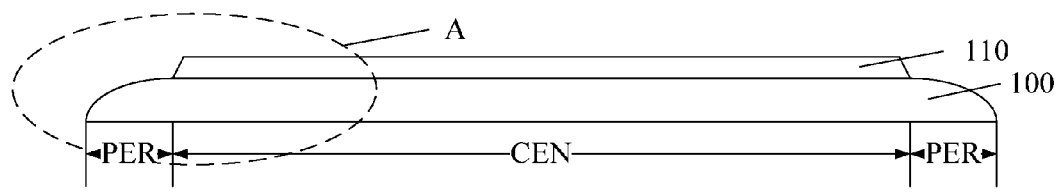
FIGS. 6-9 illustrate structures corresponding to certain stages of an exemplary fabrication process of a wafer structure consistent with the disclosed embodiments.
Figure 7:
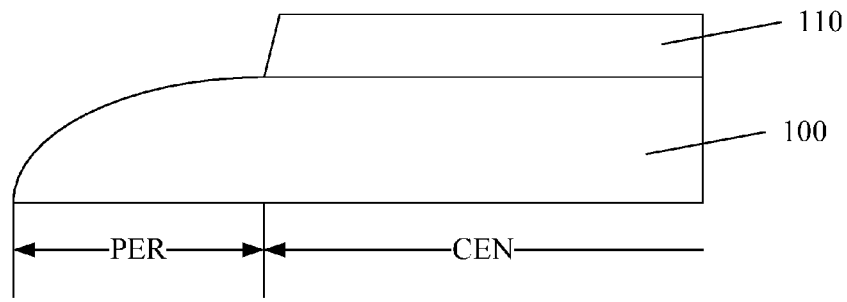

As shown in FIG. 12, at the beginning of the fabrication process, a wafer with certain structures is provided (S101). FIGS. 6-7 illustrate a corresponding structure. FIG. 7 is a zoom-in image of the circle "A" illustrated in FIG. 6.

As shown in FIGS. 6-7, a wafer 100 is provided. The wafer 100 may include a central region "CEN" and a surrounding peripheral region "PER". An interlayer dielectric layer (IDL) 110 may be formed on the wafer 100 in the central region "CEN".

A plurality of semiconductor devices (not shown) may be formed on the wafer 10 in central region "CEN". To achieve electrical connections among the semiconductor devices and between the semiconductor devices and the external devices and circuits, an interconnect structure may be subsequently formed in the interlayer dielectric layer 110 that covers the central region "CEN" of the wafer 100.

In one embodiment, the wafer 100 may have a circular shape. Thus, the peripheral region "PER" may be a circular ring region surrounding the central region "CEN" of the wafer 100. The wafer 100 may be made of any appropriate materials. In one embodiment, the wafer 100 is made of silicon.

In one embodiment, during an etching process for forming the interconnect structure, a collapsing of the sidewalls of the mask layer and/or the photoresist layer may happen in the peripheral region (PER). Thus, during the etching process for forming the interconnect structure, the mask layer may also only cover the central region "CEN" of the wafer 100. That is, after patterning the interlayer dielectric layer 110, the peripheral region "PER" of the wafer 100 may be exposed.

In one embodiment, to obtain a clean surface and improve the quality of the subsequent semiconductor processes, the wafer 100 may be cleaned by removing the native oxide layer on the wafer 100. The cleaning process may improve the yield of the semiconductor devices.

The interlayer dielectric layer 110 may be made of any appropriate material, such as silicon oxide, or silicon oxynitride, etc. Various processes may be used to form the interlayer dielectric layer 110, such as a chemical vapor deposition (CVD) process, or a physical vapor deposition (PVD) process, etc.

Figure 8:
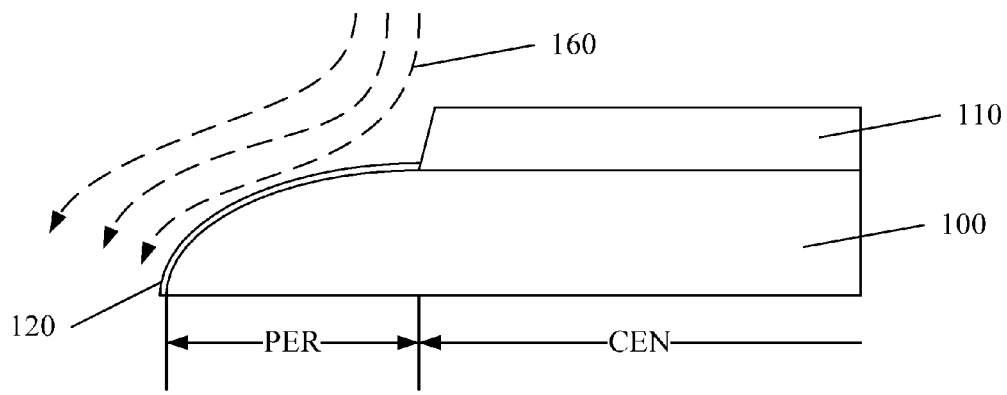

Returning to FIG. 12, after providing the wafer 100 with the interlayer dielectric layer 110, a buffer layer may be formed (S102). FIG. 8 illustrates a corresponding semiconductor structure.

As shown in FIG. 8, a buffer layer 120 is formed on the surface of the wafer 100 in the peripheral region "PER". The buffer layer 120 may be in between the wafer 100 and the subsequently formed glue layer.

The buffer layer 120 may gradually reduce the lattice mismatch between the glue layer and the wafer 100 in the peripheral region "PER" and the stress between the glue layer and the wafer 100 in the peripheral region "PER". Accordingly, the possibility for forming defects in the glue layer in the peripheral region "PER" may be reduced. Thus, the performance of the semiconductor devices may be enhanced; and the yield of the semiconductor devices may be improved.

The buffer layer 120 may be made of any appropriate material. In one embodiment, the interlayer dielectric layer 110 may be made of silicon oxide; and the buffer layer 120 may also be made of silicon oxide. Using a same material for the interlayer dielectric layer 110 and the buffer layer 120 may be able to reduce the effect of the buffer layer 120 to the semiconductor devices in the center region "CEN" during the fabrication of the buffer layer 120.

The thickness of the buffer layer 120 may be any appropriate value. If the thickness of the buffer layer 120 is too small, it may be unable to have an enough buffering effect between the subsequently formed glue layer and the wafer 100. If the thickness of the buffer layer 12o0 is too large, it may cause a wasting of material; and may increase the technical difficulties. In one embodiment, the thickness of the buffer layer 120 may be in a range of approximately 2 nm-5 nm.

Various processes may be used to form the buffer layer 120. In one embodiment, as shown in FIG. 8, the buffer layer 120 is formed by spraying an oxidizer 160 to the peripheral region "PER" of the wafer 100. Because the wafer 100 may be cleaned to remove the native oxide layer on the surface of the wafer 100 in the peripheral region "PER", the buffer layer 120 made of oxide material may be formed when the oxidizer 160 contacts with the exposed portion of the wafer 100 in the peripheral region "PER". Such a spray method for forming the buffer layer 120 may be able to better control the contact area between the oxidizer 160 and the wafer 100. Further, the spray method may be relatively simple; and the production cost may be relatively low.

The oxidizer 160 may include any appropriate chemicals. In one embodiment, the oxidizer is ozone water, i.e., a water solution of ozone ($O_3$). When the ozone water contacts with the exposed surface of the wafer 100 in the peripheral region "PER", a chemical reaction: $3Si+2O_3=3SiO_2$, may happen. Thus, an oxide buffer layer 120 may be formed.

In one embodiment, ozone ($O_3$) may be mixed with water by a mixing pump.

Such a method may increase the solubility of the ozone gas in water.

In one embodiment, the concentration of the ozone in the ozone water may be in a range of approximately 0.5 g/L-1 g/L. The flow rate of the ozone water may be in a range of approximately 600 ml/min-1200 ml/min. The spray time may be in a range of approximately 3 mins-5 mins. Such a parameter set may form the buffer layer 120 with a thickness in a range of approximately 2 nm-5 nm.

Figure 9:
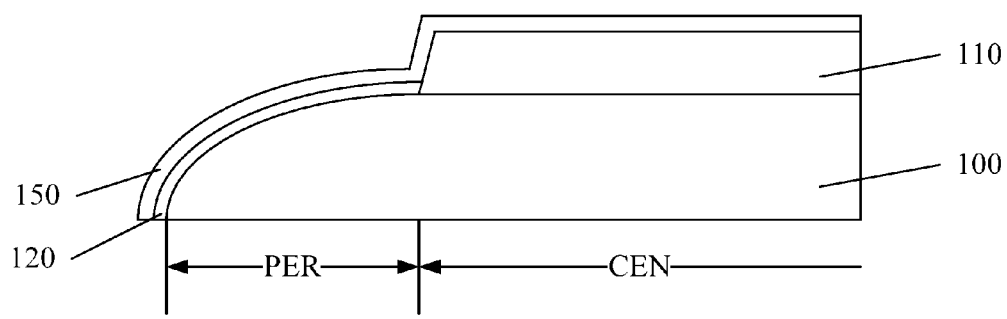

Returning to FIG. 12, after forming the buffer layer 120, a glue layer may be formed (S103). FIG. 9 illustrates a corresponding semiconductor structure.

As shown in FIG. 9, a glue layer 150 is formed on the buffer layer 120 and the interlayer dielectric layer 110. The glue layer 150 may be used to increase the interconnect strength between a subsequently formed interconnect structure and the wafer 100.

During a process for forming an interconnect structure, metal layers may be deposited on the wafer 100. To increase the interconnect strength between the interconnect structure and the wafer 100, i.e., increase the adhesion force between the metal layers and the wafer 100, and to prevent the metal atoms in the interconnect structure from diffusing into the wafer 100 and the interlayer dielectric layer 110, it may need to form the glue layer 150 before forming the interconnect structure.

The glue layer 150 may be made of any appropriate material. In one embodiment, the glue layer is made of TiN, or Ti. TiN or Ti may be able to effectively increase the interconnect strength between the interconnect structure and the wafer 100; and prevent the diffusion of metal atoms. Further, the glue layer 150 may also be used as an antireflective layer to reduce the reflection of the light of the subsequent photolithography process. Thus, the resolution of the photolithography process may be improved.

Various processes may be used to form the glue layer 150, such as a CVD process, a PVD process, or an atomic layer deposition process, etc.

Thus, a wafer structure may be formed by the disclosed methods and processes. FIG. 10 illustrates a corresponding wafer structure.

As shown in FIG. 10, the wafer structure may include a wafer 200 having a center region "CER" and a peripheral region "PER" surrounding the center region "CER"; and an interlayer dielectric layer 210 formed on the surface of the wafer 200 in the center region "CER". In one embodiment, semiconductor devices may be formed in the center region "CER" of the wafer 200. To achieve an electrical connection among the semiconductor devices, and between the semiconductor devices and external components, etc., interconnect structures may need to be formed in the interlayer dielectric layer 200 in the center region "CER". Specifically, the wafer 200 may be round; and the peripheral region "PER" may be a circular ring surrounding the center region "CER". Such a shape may reduce the technical difficulties for forming the wafer structure; and may improve the yield of the semiconductor devices.

To avoid the collapsing of photoresist, and/or the mask layer in the peripheral region "PER" of the wafer 200, the interlayer dielectric layer 210 may only cover the center region "CER" of the wafer 200. That is, the peripheral region "PER" may be exposed after forming the interlayer dielectric layer and before the other subsequent process. To obtain a clean surface, and improve the quality of the subsequent semiconductor processes, the wafer 200 may be cleaned to remove the native oxide layer.

The wafer structure may also include a buffer layer 220 on the wafer 200 in the peripheral region "PER". The buffer layer 220 may be in between the subsequently formed glue layer and the substrate 200, and may be able to gradually reduce the lattice mismatch between the glue layer and the wafer 200 in the peripheral region "PER"; and thus reduce the stress between the glue layer and the wafer 200 in the peripheral region "PER". Accordingly, the possibility for forming defects in the peripheral region "PER" may be reduced; the performance of the semiconductor devices may be improved; and the yield of the semiconductor devices may be increased.

In one embodiment, the interlayer dielectric layer 210 is made of silicon oxide; and the buffer layer 220 is also made of silicon oxide. Using a same material in both the interlayer dielectric layer 210 and the buffer layer 220 may reduce effects to the semiconductor devices in the center region "CEN" during the process for forming the buffer layer 220; and may avoid damaging the semiconductor devices in the center region "CEN".

The thickness of the buffer layer 220 may be any appropriate value. If the buffer layer 220 is too thin, it may not have enough buffering effect between the subsequently formed glue layer and the wafer 200. If the buffer layer 220 is too thick, it may increase the material waste and the process difficulties. In one embodiment, the thickness of the buffer layer 220 may be in a range of approximately 2 nm-5 nm.

Further, the wafer structure may also include a glue layer 250 covering the buffer layer 220 and the interlayer dielectric layer 210. In one embodiment, during a process for forming contact through holes, it may need to deposit metal to form interconnect structures. To improve the adhesion strength between the interconnect structures and the wafer 200, and also to prevent the metal atoms in the interconnect structures from diffusing into the wafer 200 and the interlayer dielectric layer 210, it may need to form the glue layer 250 before forming the interconnect structures.

The glue layer 250 may be made of TiN, or Ti, etc. TiN or Ti may be able to effectively increase the adhesion strength between the interconnect structures and the wafer 200; and prevent the diffusion of metal atoms. Further, the glue layer 250 made of TiN or Ti may also be used as an antireflective layer to reduce the reflection during the subsequent photolithography process. Thus, the resolution of the photolithography process may be improved.

FIG. 11 illustrates a spray apparatus consistent with disclosed embodiments. The spray apparatus may be used to form the disclosed wafer structures; and other appropriate structures.

As shown in FIG. 11, the spray apparatus may include a chunk 310 and a spray nozzle 320 disposed above the chunk 310. The chunk 310 may be used to hold a wafer (not shown), and do high-speed rotations. The spray nozzle 320 may be used to spray a liquid to the wafer held by the chunk 310 to form a buffer layer in the peripheral region of the wafer.

Specifically, the chunk 310 is laterally disposed, and the wafer is placed on the chunk 310. The chunk 310 may have a plurality of chuck clamps (not labeled) to hold and fix the wafer.

The spray nozzle 320 may be disposed over the chunk 310 at the side which holds the wafer. The liquid sprayed from the spray nozzle 320 will fall down on the surface of the wafer.

In one embodiment, the spray apparatus is used to form the buffer layer on the peripheral region of the wafer. Thus, the spray nozzle 320 may be disposed close to the peripheral region of the chunk 310. Further, the spray nozzle 320 may be toward a direction away from the center of the wafer such that the liquid sprayed from the spray nozzle 320 may fall down on the surface of the wafer in the peripheral region.

Further, for conveniently processing the wafer and reducing the volume of the spray apparatus, in one embodiment, the chunk 310 may be a movable chunk 310 rotating around the central axis of the wafer held by the chunk 310. Specifically, the chunk 310 may be disposed on a rotating axial 301. The rotating axial 301 may cause the chunk 310 to rotate around an axis perpendicular to the surface of the wafer. Further, the rotation of the chunk 310 may also be able to cause the liquid falling down to the surface of the wafer to flow to the peripheral region under the centrifuge force. Then, the peripheral portion of the wafer may be processed (i.e., forming a buffer layer).

The chunk 310 may rotate with any appropriate speed. If the chuck rotates too fast, the liquid sprayed on the surface of the wafer may be unable to react with the wafer with a desired scale. If the chunk 310 rotates too slow, the wafer processing rate may be relatively low. In one embodiment, the rotating speed of the chuck 310 may be in range of approximately 60 rpm-300 rpm.

Further, the spray apparatus may also include a mixing pump 330. The mixing pump 330 may be connected with the spray nozzle 320; and may be configured to feed the liquid to the spray nozzle 320.

Specifically, the outlet of the mixing pump 330 may be connected with the spray nozzle 320 to feed the liquid to the spray nozzle 320. Further, the mixing pump 330 may also apply a certain scale of pressure to the liquid sprayed out from the spray nozzle 320 such that the liquid may be uniformly sprayed out from the spray nozzle 320.

In one embodiment, the spray apparatus may be used to form an oxide buffer layer in the peripheral region of the wafer. Specifically, the liquid sprayed from the spray nozzle 320 may be ozone water. Thus, the mixing pump 330 may also include a first inlet 331 configured to feed ozone gas; and a second inlet 332 configured to feed DI water. The mixing pump 330 may also include a mixing chamber (not labeled). The mixing chamber may be connected with the first inlet 331 and the second inlet 332, and may be used to mix the ozone gas coming from the first inlet 331 and the DI water coming from the second inlet 332 to form the ozone water. Using the mixing pump 330 to mix the ozone gas and the DI water may increase the concentration of the ozone in the ozone water; increate the oxidation ability of the ozone water; and increase the wafer processing efficiency of the spray apparatus.

Further, the spray apparatus may also include a nozzle frame 340 and a motor 350 connected to the nozzle frame 340. The nozzle frame 340 may be used to fix the position of the spray nozzle 320.

In one embodiment, the nozzle frame 340 may be a retractable frame. The retractable nozzle frame 340 may control the relative position between the wafer disposed on the chunk 310 and the spray nozzle 320 by extending or retracting so as to change the position of the sprayed area of the wafer.

The motor 350 may be used to control the extending and the retracting of the nozzle frame 340 so as to control the sprayed area of the wafer. Specifically, the motor 350 may be a step motor. The step motor may have the control ability to the extending and retracting of the nozzle frame 340.

Further, the spray apparatus may also include an enclosure 360 surrounding the chunk 310. The enclosure 360 may also be referred to as a cover. The enclosure 360 may be configured to prevent the liquid splashing during the spray nozzle 320 is spraying the liquid.

Specifically, the enclosure 360 may be a cylindrical shell without a bottom. During the spray nozzle 320 is spraying the liquid, the enclosure 360 may surround the chunk 310 to prevent the liquid from splashing. Thus, it may prevent the liquid from contaminating other apparatus and/or environment.

In one embodiment, the enclosure 360 may be an articulated structure, i.e., can be lifted up and down along the rotating axial of the chuck 310. That is, when the spray nozzle 320 is spraying the liquid, the enclosure 360 may be at a first position to surround the chuck 310 to prevent the liquid splashing. When the spray nozzle 320 is not spraying liquid, the enclosure 360 may be at a second position to expose the chuck 310; and it may be convenient to change the wafer on the chunk 310 at the second position. The first position may be above the second position.

Further, to avoid polluting the environment, and improve the using efficiency of raw materials (i.e., the liquid, etc.), in one embodiment, the spray apparatus may also include a recycling unit 370. The recycling unit 370 may be under the chunk 310; and may be used to recycle the un-used liquid sprayed from the spray nozzle 320. In one embodiment, the recycling unit 370 may include a recycling cell 371 and a drain 372.

The recycling cell 371 may be used to collect; and store the un-used liquid sprayed from the spray nozzle 320. In a plane parallel to the wafer surface, the cross-sectional area of the recycling cell 371 is greater than the cross-sectional area of the enclosure 360. Such a configuration may be able to collect all the liquid splashed on the enclosure 360.

The drain 372 may be under the recycling cell 371. The drain 372 may be used to drain out the liquid collected in the recycling cell 372 for subsequent processing.

Thus, according to the disclosed methods, structures and apparatus, by forming a buffer layer on the wafer in the peripheral region, the lattice mismatch between the wafer and the glue layer may be reduced. Thus, the stress between the wafer and the glue layer may be reduced; and the possibility for forming bubbles and peeling issues in the peripheral region of the wafer may be reduced. Accordingly, the performance of the semiconductor devices formed on such a wafer may be enhanced; and the yield of the semiconductor devices may be improved.

Further, the buffer layer may be made a material the same as the interlayer dielectric layer. Thus, during the fabrication process of the buffer layer, the effect to the semiconductor devices in the center region of the wafer may be reduced; and the yield of the semiconductor devices may be improved.

Further, the buffer layer may be formed by spraying oxidizer to the peripheral region of the wafer. Such a method may be able to better control the contact area between the oxidizer and the wafer so as to better control the covering region of the buffer layer. Thus, it may reduce the effect to the semiconductor devices in the wafer during the fabrication of the buffer layer. The fabrication process of the buffer layer may be relatively simple; and the production cost may be relatively low.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a wafer structure, comprising: providing a wafer having a central region and a peripheral region surrounding the central region; forming an interlayer dielectric layer on a surface of the wafer in the central region, the interlayer dielectric layer not being in the peripheral region; forming a buffer layer on the surface of the wafer in the peripheral region, the buffer layer not being in the central region; and forming a glue layer on the interlayer dielectric layer and the buffer layer, wherein the buffer layer is used to reduce the lattice mismatch between the wafer and the glue layer; and reduce the stress between the wafer and the glue layer.

2. The method according to claim 1, wherein:
the interlayer dielectric layer is made of silicon oxide; and
the buffer layer is made of silicon oxide.

3. The method according to claim 2, wherein:
the buffer layer is formed by spraying an oxidizer to the peripheral region of the wafer.

4. The method according to claim 3, wherein:
the oxidizer is ozone ($O_3$) water.

5. The method according to claim 4, wherein:
a concentration of ozone ($O_3$) in the ozone water is in a range of approximately 0.5 g/L-1 g/L;
a flow rate of the ozone water is in a range of approximately 600 ml/min-1200 ml/min; and
a spray time is in a range of approximately 3 min-5 min.

6. The method according to claim 1, wherein:
a thickness of the buffer layer is in a range of approximately 2 nm-5 nm.

7. The method according to claim 1, wherein:
the glue layer is made of one of TiN and Ti.

* * * * *